United States Patent [19]

Croup

[11] 4,071,111

[45] Jan. 31, 1978

[54] WEATHERPROOF LOUDSPEAKER ASSEMBLY AND METHOD OF MAKING SAME

[75] Inventor: Robert E. Croup, Indianapolis, Ind.

[73] Assignee: Acoustic Fiber Sound Systems, Inc., Indianapolis, Ind.

[21] Appl. No.: 681,022

[22] Filed: Apr. 28, 1976

[51] Int. Cl.[2] ........................ H05K 5/00; A47B 81/06

[52] U.S. Cl. .................................... 181/149; 181/167; 181/199

[58] Field of Search ............... 181/199, 149, 155, 148, 181/167

[56] References Cited

U.S. PATENT DOCUMENTS

| | | | |
|---|---|---|---|
| 1,377,677 | 5/1921 | Gelbert | 181/167 |
| 2,003,908 | 6/1935 | Smith et al. | 181/167 |
| 2,829,728 | 4/1958 | Brown | 181/149 |
| 3,037,577 | 6/1962 | Steglich | 181/155 |
| 3,391,754 | 7/1968 | Montanaro | 181/149 |
| 3,731,760 | 5/1973 | Hammes | 181/199 |
| 3,938,618 | 2/1976 | Ambruoso | 181/149 |
| 3,941,207 | 3/1976 | Croup | 181/199 |
| 3,946,832 | 3/1976 | Takano et al. | 181/167 |

*Primary Examiner*—Stephen J. Tomsky

*Attorney, Agent, or Firm*—Vogel, Dithmar, Stotland, Stratman & Levy

[57] ABSTRACT

A weatherproof loudspeaker assembly includes a box-like one-piece open-front plastic housing and a corrugated fiberboard member folded so as to line the inside of the housing with two crossed layers of corrugations on each of the walls surrounding the open front. A plastic grille plate has a plurality of slots therethrough separating forwardly projecting vanes, and a loudspeaker has a water-repellent front portion including a peripheral mounting and sealing flange mounted in watertight sealing engagement with the rear of the grille plate in surrounding relationship with the slots by means of plastic posts extending from the grille plate through holes in the loudspeaker flange and melted in place to form a rivet-like fastening. The grille plate is screwed to the housing or ultrasonically shear-welded to the housing around the entire perimeter of the open front for closing same with the loudspeaker disposed within the corrugated member and with loudspeaker lead wires extending through a hole in the bottom of the housing. A plastic mounting plate is disposed in a recess in the outer surface of the housing bottom surrounding the hole and has an energy-directing ridge which is ultrasonically welded to the housing completely around the hole and the lead wires. The housing is molded of material blown with a blowing agent to prevent sinks.

32 Claims, 22 Drawing Figures

FIG. 7
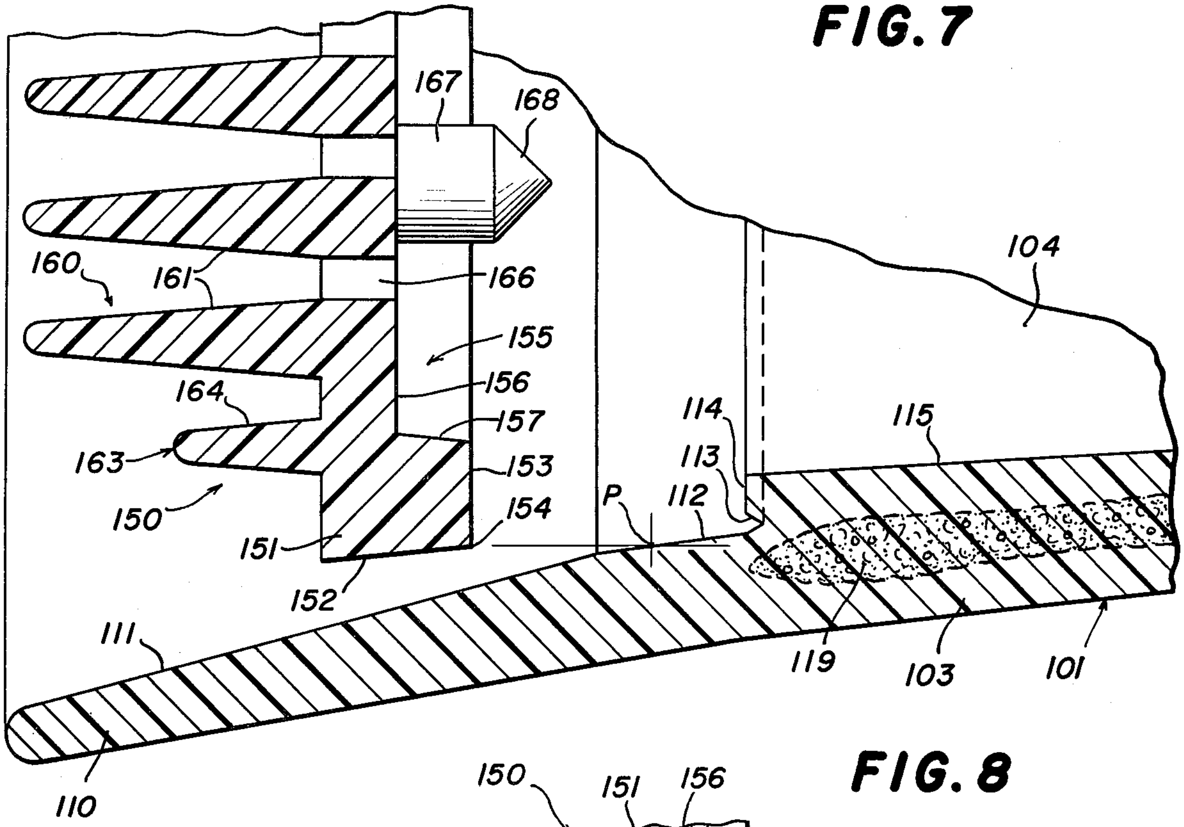
FIG. 8
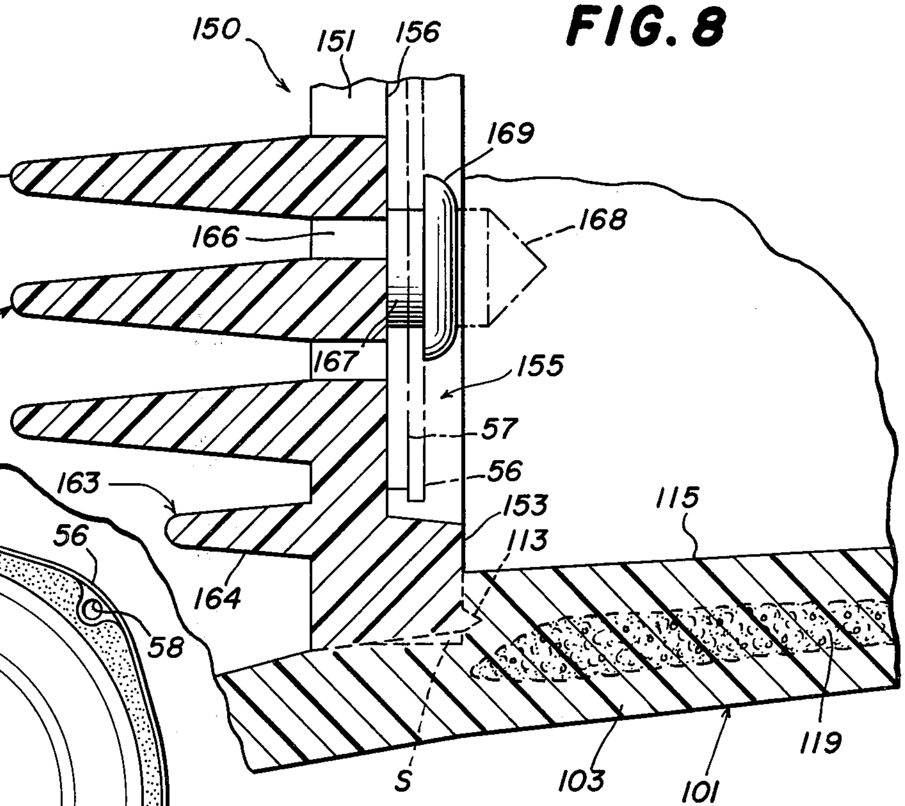
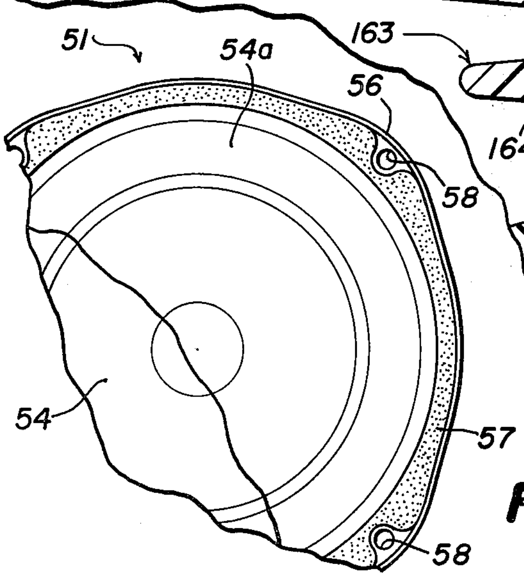
FIG. 19

WEATHERPROOF LOUDSPEAKER ASSEMBLY AND METHOD OF MAKING SAME

BACKGROUND OF THE INVENTION

The present invention relates to loudspeaker assemblies, and particularly to all-weather type loudspeaker assemblies intended for use outdoors in a position exposed to the elements, while maintaining good acoustical quality.

Outdoor-type loudspeaker assemblies are known in the prior art, but such assemblies are typically of heavy and relatively expensive construction and are characterized by poor quality sound reproduction because the materials of the loudspeaker enclosure which were necessary to insure weatherproof construction were not compatible with high acoustical performance. Furthermore, such prior loudspeaker assemblies have not been truly watertight.

Prior loudspeaker assemblies having multi-layered enclosures of corrugated material are shown in U.S. Pat. No. 3,789,953 granted Feb. 5, 1974 to Scott F. Everitt, and in my copending U.S. application Ser. No. 500,597, filed Aug. 26, 1974, entitled "LOUDSPEAKER ASSEMBLY" now U.S. Pat. No. 3,993,345, and assigned to the assignee of the present invention. While such loudspeaker assemblies have been highly effective in terms of providing good acoustical properties, the corrugated fiberboard used in the construction of the enclosures is highly susceptible to damage or destruction by water, and thus such prior assemblies have not been suitable for outdoor use where they would be exposed to rain, snow or the like.

Corrugated fiberboard loudspeaker enclosures have been disposed within outer plastic shells, as is my copending application Ser. No. 626,729, filed Oct. 29, 1975, and entitled "ENCLOSURE FOR AUTOMOBILE TRUNK-MOUNTED LOUDSPEAKER", now U.S. Pat. No. 3,993,345 and assigned to the assignee of the present invention, but such prior enclosures have been solely for the purpose of protecting the fiberboard from dirt, damage by physical contact and the like, and are neither intended for nor suitable for exposure to moisture.

SUMMARY OF THE INVENTION

The present invention provides an all-weather loudspeaker assembly wherein the loudspeaker has a water-repellent front portion and is enclosed within a housing having a speaker aperture, the speaker front portion cooperating with the housing to close the aperture so as to form a watertight assembly.

It is a feature of the present invention that the housing comprises an integral open-front housing member and a grille plate secured to the housing member around the entire perimeter of the open front thereof for closing same, the loudspeaker being fixedly secured to the rear of the grille plate to provide a watertight closure of apertures in the grille plate which facilitate the emission of sound waves from the housing.

Another feature of this invention is that the loudspeaker lead wires are passed through a hole in the bottom of the housing, which hole is surrounded by and communicates with a recess on the outer surface of the housing in which is received a mounting member secured to the housing for providing a watertight seal completely around the lead wires and the exit hole therefor.

It is another feature of this invention that the inside of the housing is lined with corrugated material having plural crossed layers of corrugations to facilitate suppression of undesirable sound waves in the housing.

Yet another feature of this invention is that the corrugated material inside the housing is formed of a single integral sheet cut to form a plurality of hingedly interconnected panels which are foldable to the desired assembled configuration for lining the inside of the housing.

Another important feature of the present invention is that the grille plate and housing and mounting means are formed of plastic, the loudspeaker assembly being constructed by ultrasonically welding the grille plate to the housing around the entire perimeter of the front opening and ultrasonically welding the mounting means to the housing to provide the watertight seal around the loudspeaker lead wires and exit opening.

Another feature of the invention is that the grille plate includes rearwardly extending plastic posts which pass through complementary openings in the loudspeaker mounting flange with the distal ends ultrasonically melted to form enlarged heads to provide a rivet-like fastening of the loudspeaker to the grille plate.

These features are accomplished in the present invention, and it is an object of the present invention to accomplish these desired results by providing a weatherproof loudspeaker assembly comprising a closed housing having an aperture therein to facilitate the emission of sound waves therefrom and being impervious to water except through the aperture, and loudspeaker means disposed within the housing and supported by the housing and having a water-repellent front portion closing the aperture and cooperating with the housing to form a substantially watertight seal therebetween around the entire perimeter of the aperture.

In connection with the foregoing object, it is another object of this invention to provide a weatherproof loudspeaker assembly of the type set forth, wherein the closed housing includes an integral housing member having a loudspeaker opening therein and a grille plate secured to the housing member for closing the loudspeaker opening, the aperture being formed in the grille plate.

It is another object of this invention to provide a weatherproof loudspeaker assembly of the type set forth, wherein the housing has a second aperture therein to accommodate the passage therethrough of loudspeaker lead wires, and further including mounting means secured to the housing and cooperating therewith and with the loudspeaker lead wires to form a watertight closure for the second aperture.

Still another object of this invention is to provide a weatherproof loudspeaker assembly of the type set forth, wherein the housing includes four side walls and two end walls interconnected in the form of a hexahedron, and an integral corrugated member having cuts partway through the thickness thereof respectively to form hinges which divide the member into a plurality of panels which are folded to an assembled configuration defining corrugated walls which respectively lie against the housing walls, each of the side walls having two layers of crossed corrugations.

It is another important object of the present invention to provide a method of making a weatherproof loudspeaker assembly of the type set forth, wherein the grille plate is welded to the housing member, both being formed of waterimpermeable material.

In connection with the foregoing object, it is another object of this invention to provide a method of the type set forth, wherein the housing member and the grille plate are both formed of plastic and are ultrasonically shear-welded together.

Still another object of this invention is to provide a method of the type set forth, wherein the grille plate includes a plurality of rearwardly extending posts spaced around the aperture, the loudspeaker means having a peripheral sealing attachment flange provided with openings therethrough dimensioned and arranged respectively to receive the posts therethrough, and including the step of heating and melting the distal ends of the posts to form enlarged heads which cooperate with the grille plate securely to trap the attachment flange therebetween.

Still another object of this invention is to provide a method of the type set forth, wherein a plastic mounting member is provided and is ultrasonically welded to the housing member so as to provide a watertight closure around the lead wire aperture.

Further features of the invention pertain to the particular arrangement of the parts of the loudspeaker assembly and of the steps of the method of making same whereby the above-outlined and additional operating features thereof are attained.

The invention, both as to its organization and method of operation, together with further objects and advantages thereof, will best be understood by reference to the following specification taken in connection with the accompanying drawings.

BRIEF DESCRIPTION OF THE DRAWINGS

FIG. 7 is a still further enlarged fragmentary view in vertical section of the lower left corner of the loudspeaker housing as illustrated in FIG. 3, with the grille plate and housing member shown prior to their being welded together and prior to the attachment of the loudspeaker thereto;

FIG. 8 is a view like FIG. 7, with the loudspeaker and grille plate and housing member all shown assembled together;

FIG. 19 is a front elevational view of the loudspeaker of the present invention;

DESCRIPTION OF THE PREFERRED EMBODIMENT

Figure 1:
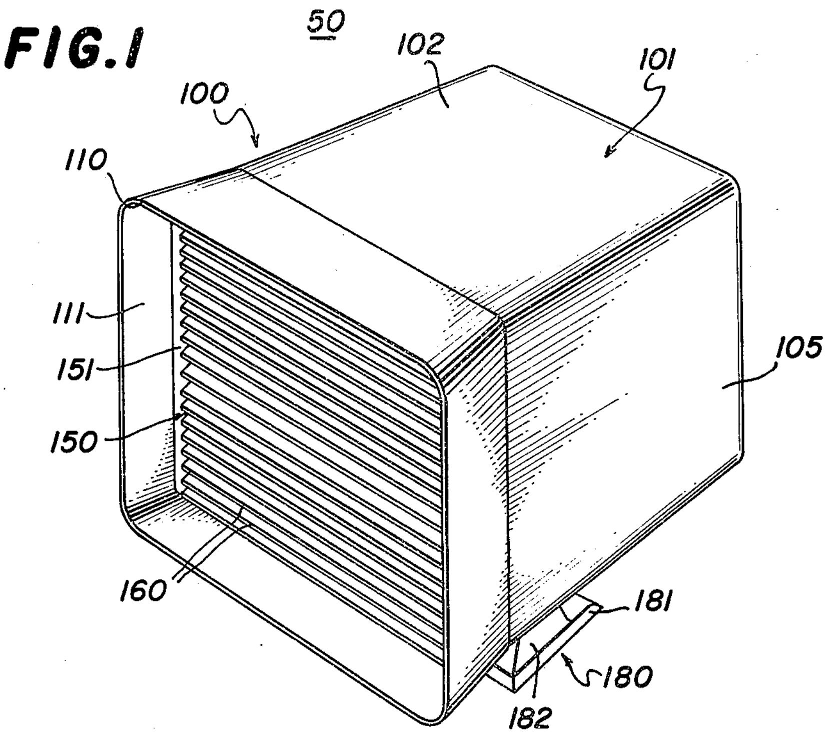
FIG. 1 is a front perspective view of the loudspeaker assembly of the present invention.
Figure 2:
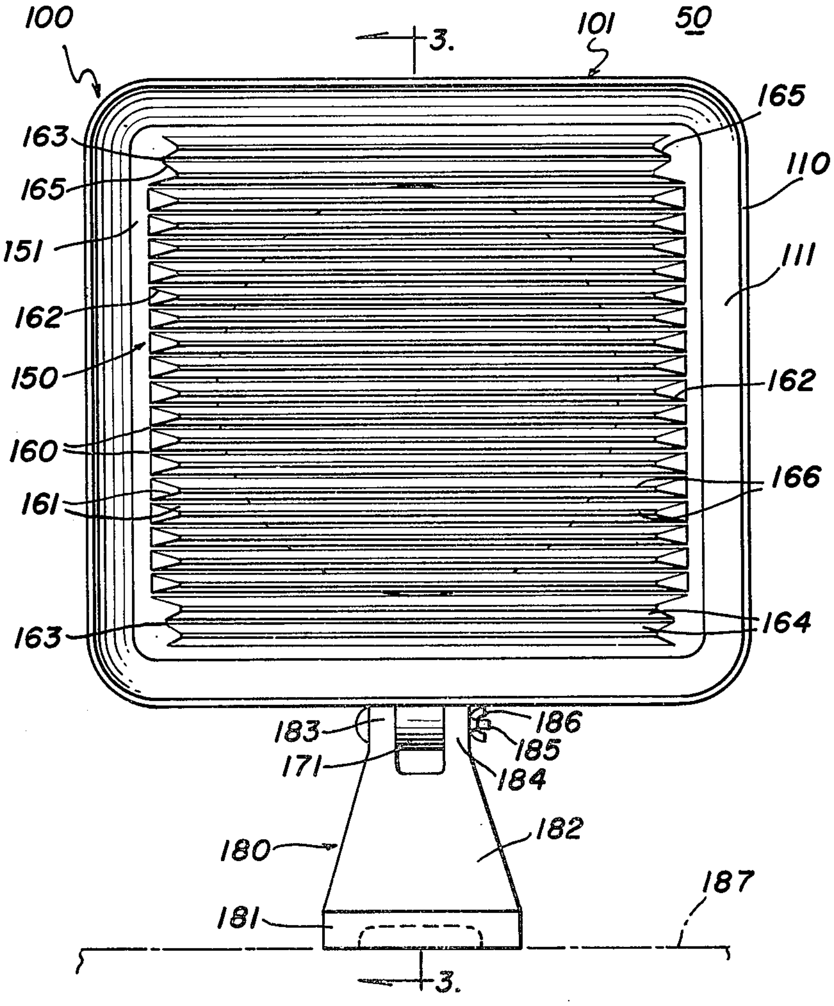
FIG. 2 is an enlarged front elevational view of the loudspeaker assembly of FIG. 1.
Figure 3:
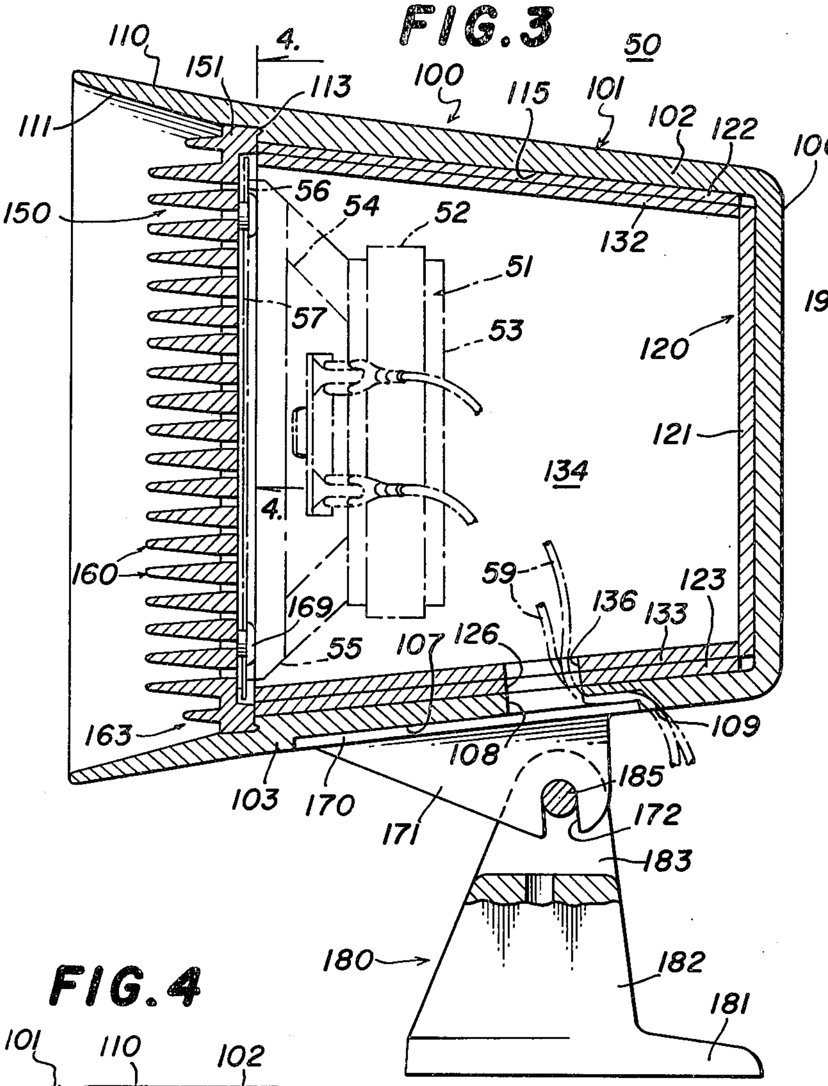
FIG. 3 is a side view partially in elevation and partially in vertical section of the loudspeaker assembly of FIG. 2, showing the internal construction of the loudspeaker housing.

Referring to FIGS. 1 through 3 of the drawings, there is illustrated a loudspeaker assembly, generally designated by the numeral 50, which is constructed in accordance with and embodies the features of the present invention, the loudspeaker assembly 50 including a loudspeaker 51 mounted in an enclosure 100 which includes a housing 101, a corrugated member 120, a grille plate 150, a mounting plate 170 and a base 180. The loudspeaker 51 includes a magnet 52 carried by a housing 53 and coupled to a speaker cone including a frustoconical diaphragm 54. Coupled to the housing 53 and surrounding the diaphragm 54 for protection of same is a mounting plate 55 provided at the front end thereof with an outwardly extending attachment flange 56, which is fixedly secured to the front edge of the diaphragm 54 around the entire perimeter thereof. Also fixedly secured to the attachment flange 56 and projecting forwardly thereof around the entire perimeter thereof is a seal ring or gasket 57. The attachment flange 56 is provided with four substantially equidistantly spaced-apart holes 58 therethrough, for a purpose to be described more fully below, and is also provided with a pair of conductors or lead wires 59. It is an important feature of the present invention that the front or forwardly facing portions of the loudspeaker 51, including the outer surface of the diaphragm 54, are all water-repellent, preferably by reason of being coated with water-repellent material 54a.

The housing 101 is integrally formed of plastic, preferably by molding, and is generally in the shape of an open-ended hexahedron, including a top wall 102, a bottom wall 103, a pair of opposed side walls 104 and 105 and an end or rear wall 106, the walls 102 through 105 cooperating to define a generally rectangular front opening into the housing 101. Formed in the outer surface of the bottom wall 103 is a generally rectangular shallow recess 107 which communicates with a circular hole 108 extending entirely through the bottom wall 103. Formed in the bottom wall 103 along the base of the recess 107 is a groove or channel 109 extending from the hole 108 to the adjacent edge of the recess 107 and a slight distance therebeyond for providing communication between the hole 108 and the outside of the housing 101.

Each of the walls 102 through 105 terminates at the front end thereof in an outwardly flared and tapered continuous front flange 110 extending around the entire perimeter of the housing 101. The junction between the front flange 110 and the housing walls 102 through 105 is the same for each of the latter walls and, therefore, this junction will be described in detail only with respect to the bottom wall 103. Referring now also to FIG. 7 of the drawings, the front flange 110 includes a rearwardly and inwardly sloping inner surface 111 continuous at its rear end with a rearwardly and inwardly sloping shear surface 112 which is substantially shorter in front-to-rear dimension than the surface 111. The shear surface 112 is preferably inclined at an angle of about 7 degrees 30 minutes to the front-to-rear longitudinal axis of the housing 101, and terminates at the rear end thereof in a shallow rearwardly extending groove or trough 113 which extends around the entire inner perimeter of the housing 101 and serves to separate the shear surface 112 from a short shoulder or abutment surface 114 which extends around the entire perimeter of the housing 101 and lies in a plane substantially normal to the longitudinal axis thereof. The inner edge of the shoulder 114 intersects a flat planar inner surface 115 of the bottom wall 103 which extends rearwardly to the rear wall 106 and is continuous with the inner surfaces of the walls 102 and 104 through 106.

It is an important feature of the present invention that the inner and outer surfaces of the housing 101 be flat and uniform and avoid the local depressions or sinks which frequently occur in molded plastic parts of substantial thickness. Such sinks are formed when parts are molded of expandable plastic which, upon cooling, tends to shrink, the extent of shrinkage generally being proportional to the thickness of the part. To avoid this phenomenon, the housing 101 is molded with a blowing agent. More particularly, the housing 101 is preferably molded of a polypropylene copolymer which is blown with a nitrogen-type blowing agent such as that sold under the trademark "CELOGEN". Upon heating of the material, the blowing agent gives off gas, producing bubbles 119 (see FIGS. 7 and 8) in the molded polypropylene material and creating an internal pressure which resists the formation of sinks in the housing 100.

Referring now also to FIGS. 15 through 18 of the drawings, there is illustrated a corrugated member generally designated by the numeral 120, which includes a plurality of hingedly interconnected panels. More particularly, the corrugated member 120 includes a generally rectangular end or rear panel 121, to the four sides of which are respectively hingedly connected an outer top panel 122, an outer bottom panel 123 and two opposed outer side panels 124 and 125. Formed in the outer bottom panel 123 is a circular hole 126. Respectively hingedly connected to the panels 122 through 125 at the outer ends thereof are an inner top panel 132, an inner bottom panel 133, an inner side panel 134 and an inner side panel 135. Formed in the inner bottom panel 133 is a circular hole 136. It will be noted that the side margins of the inner side panels 134 and 135 are indented a distance substantially equal to the thickness of the corrugated material, so that these two panels are respectively narrower than the outer side panels 124 and 125.

Figure 18:
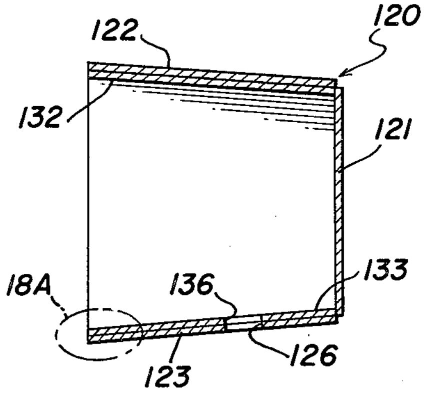
FIG. 18 is a view in vertical section taken along the line 18—18 in FIG. 17.
Figure 18A:
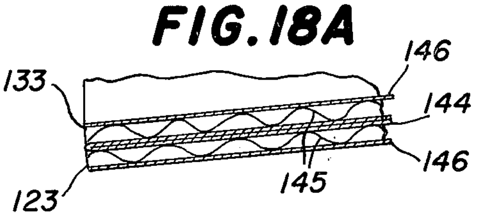
FIG. 18A is an enlarged fragmentary perspective view of a lower front corner of the corrugated member of FIG. 18, illustrating the construction of the corrugated material.

The hinged connection between the panels of the corrugated member 120 are formed by making low knife cuts along the broken lines 130 between the panels. Referring to FIG. 18A, the corrugated member 120 is preferably formed of corrugated fiberboard, which includes two liner sheets 144 and 146 which are adhesively secured to and spaced apart by a fluted or corrugated sheet 145. The low knife cuts 130 extend through one of the liner sheets 146 and through the corrugated sheet 145, but do not extend through the other liner sheet 144, that uncut liner sheet providing the hinge connections between the panels.

Figure 16:
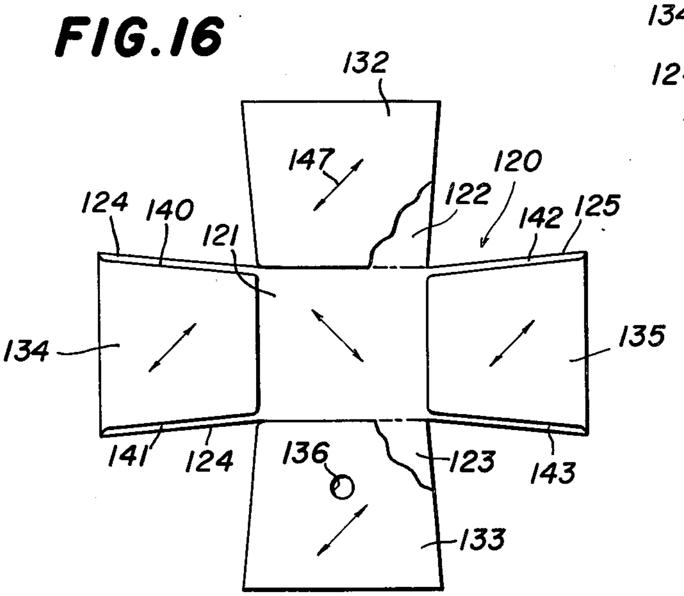
FIG. 16 is a view of the corrugated member of FIG. 15, after the inner panels have been folded over the outer panels.

In assembling the corrugated member 120, the inner panels 132 through 135 are respectively folded in over the outer panels 122 through 125 to the configuration illustrated in FIG. 16, thereby to form corrugated walls, each having two layers of corrugation. It will be noted that the narrow inner side panel 134 cooperates with the outer side panel 124 to form marginal seats or recesses 140 and 141 along the top and bottom edges thereof and, in like manner, the narrow inner side panel 135 cooperates with the outer side panel 125 to form marginal seats or recesses 142 and 143 respectively along the upper and lower edges thereof. The circular holes 126 and 136 are so positioned and dimensioned that they are substantially congruent when in the folded configuration illustrated in FIG. 16.

Figure 17:
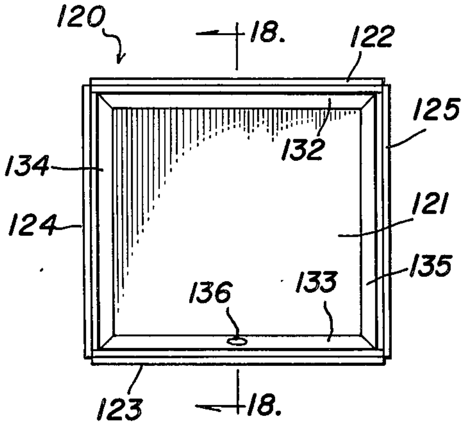
FIG. 17 is an end elevational view of the corrugated member of FIG. 16 in its assembled condition.

Next, the overlapped side panels 124 and 134 and 125 and 135 are folded up to the positions illustrated in FIG. 17, and the overlapped top panels 122 and 132 and bottom panels 123 and 133 are also folded up, with the side edges of the inner top panel 132 being respectively received in the seats or recesses 140 and 142 and with the side edges of the inner bottom panel 133 being respectively received in the seats or recesses 141 and 143. This cooperation of the panels 132 and 133 with the recesses 140 through 143 permits the corrugated member 120 to be neatly and snugly assembled without crushing the edges of any of the inner panels 132 through 135. It will, of course, be appreciated that in assembly of the corrugated member 120, the outer panels 122 through 125 may respectively be adhesively secured to the overlapping inner panels 132 through 135 and, if desired, the adjacent edges of the inner panels 132 through 135 may be adhesively secured together, securely to hold the corrugated member 120 in the assembled configuration thereof.

When thus assembled, the corrugated member 120 is inserted into the housing 101 so that the rear panel 121 lies against the inner surface of the housing end wall 106 and the panels 122 through 125 respectively lie against the inner surfaces of the housing walls 102 through 105. The corrugated member 120 is so dimensioned that when thus inserted in the housing 101, the forward or hinged edges of the panels 122 through 125 and 132 through 135 are substantially flush with the shoulder 114 on the housing 101 and the holes 126 and 136 are substantially congruent with the hole 108 in the bottom wall 103 of the housing 101. If desired, the corrugated member 120 may be adhesively secured to the inner surfaces of the housing walls 102 through 106.

It will be noted that when thus assembled, the corrugated member 120 includes two layers of corrugations along each of the housing walls 102 through 105. Furthermore, it will be noted that the corrugations of the corrugated member 120 extend in the directions indicated by the arrows 147 (see FIGS. 15 and 16). Thus, when the inner panels 132 through 135 are folded over the outer panels 122 through 125 as in FIG. 16, the directions of the corrugations in the inner panels 132 through 135 are substantially normal to the directions of the corrugations in the outer panels 122 through 125. This crossed-corrugation arrangement serves to effect cancellation of those undesirable sound waves generated within the housing 101, which are not radiated outwardly therefrom from the front of the loudspeaker, thereby having a sound-deadening or suppressing effect on the undesirable sound waves generated by the rear surface of the speaker diaphragm 54.

Additionally, it will be noted that each of the low knife cuts 130 in the corrugated member 120 is along lines disposed at acute angles substantially greater than zero degrees to the direction of the corrugations. It has been found that this arrangement greatly facilitates the use of die-cutting techniques in fabricating the corrugated member 120, thereby facilitating mass production thereof.

Figure 6:
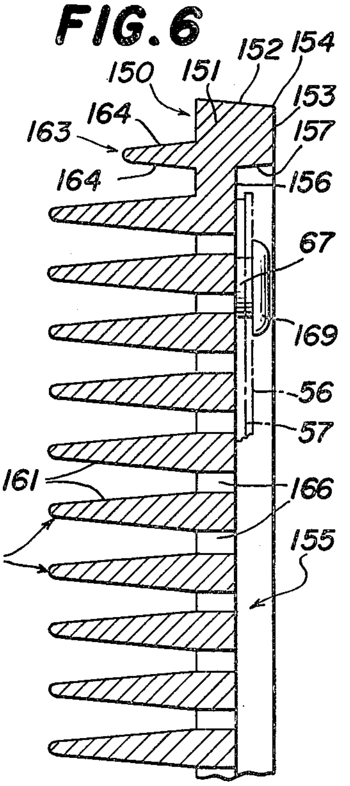
FIG. 6 is a further enlarged framentary view in vertical section taken along the line 6—6 in FIG. 4, and illustrating the grille plate prior to welding thereof to the housing.
Figure 4:
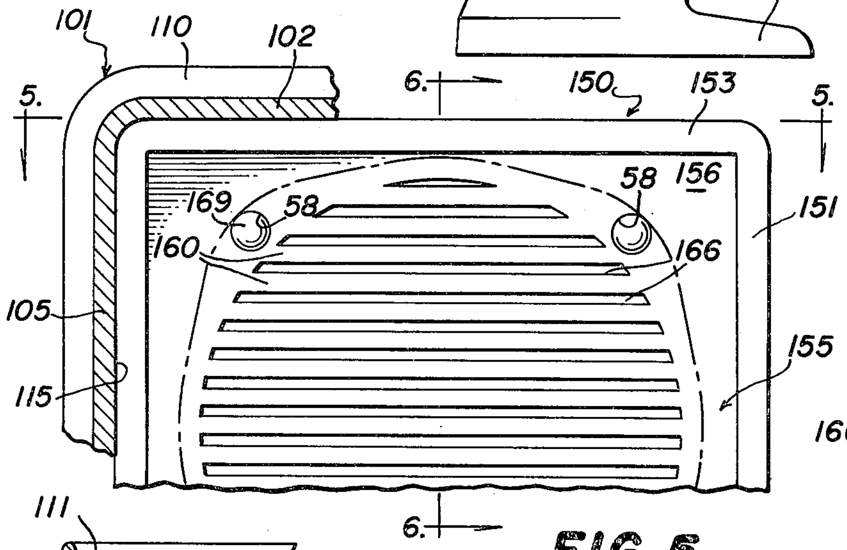
FIG. 4 is a fragmentary view in vertical section taken along the line 4—4 in FIG. 3.
Figure 5:
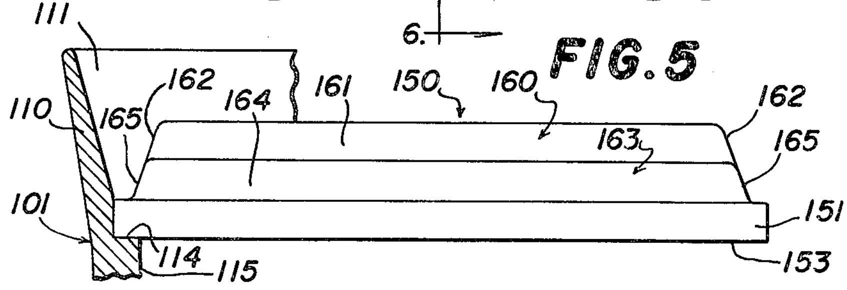
FIG. 5 is a fragmentary view in horizontal section taken along the line 5—5 in FIG. 4.
Figure 9:
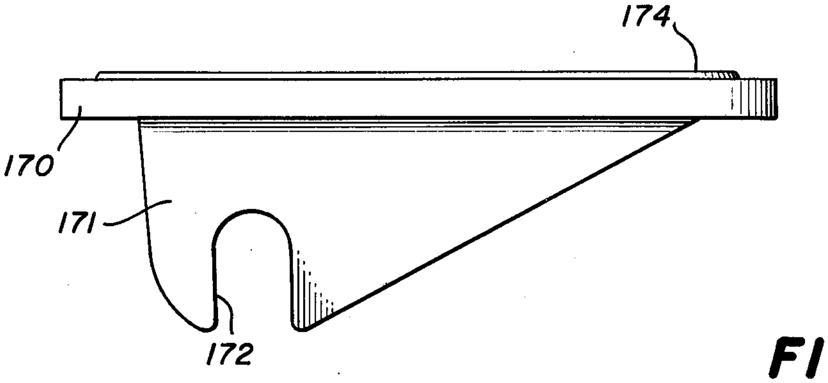
FIG. 9 is a side elevational view of the mounting plate of the present invention.
Figure 10:
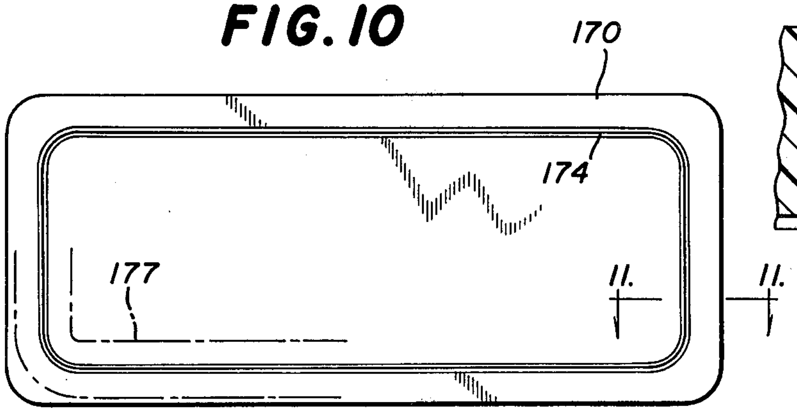
FIG. 10 is a top plan view of the mounting plate shown in FIG. 9.
Figure 11:
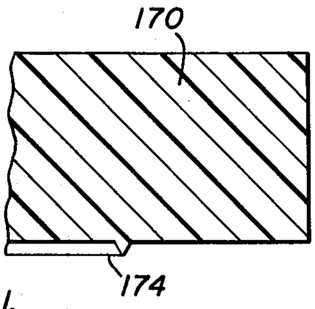
FIG. 11 is an enlarged fragmentary view in vertical section taken along the line 11—11 in FIG. 10.
Figure 14:
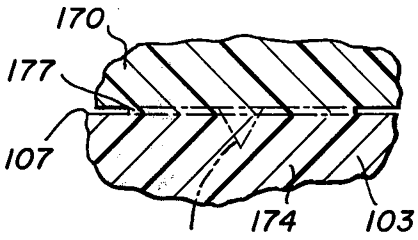
FIG. 14 is a view like FIG. 13 showing the mounting plate and housing member after having been welded together.
Figure 13:
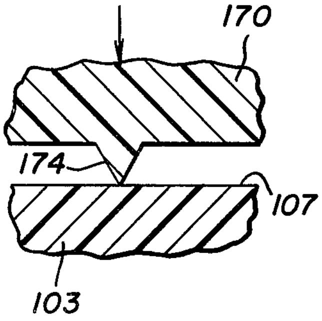
FIG. 13 is an enlarged fragmentary view in vertical section of a portion of the mounting plate of FIG. 12, shown prior to welding thereof to the housing member.
Figure 12:
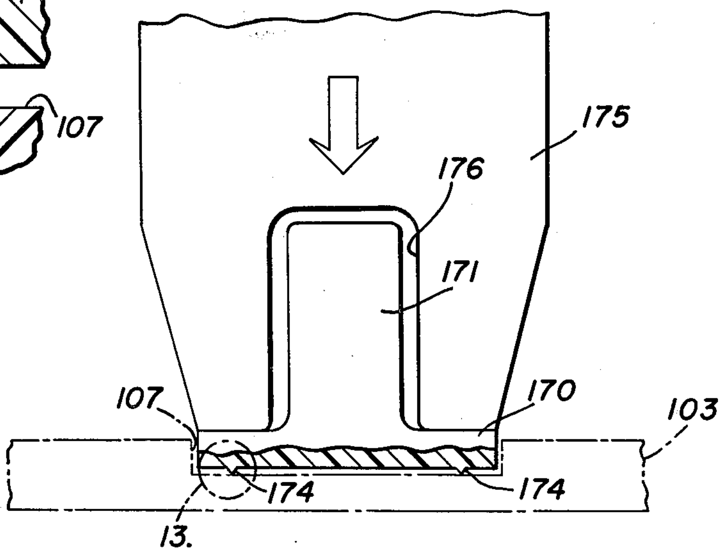
FIG. 12 is an end elevational view in partial vertical section of the mounting plate of FIG. 9, illustrating the method of attachment thereof to the housing member.
Figure 15:
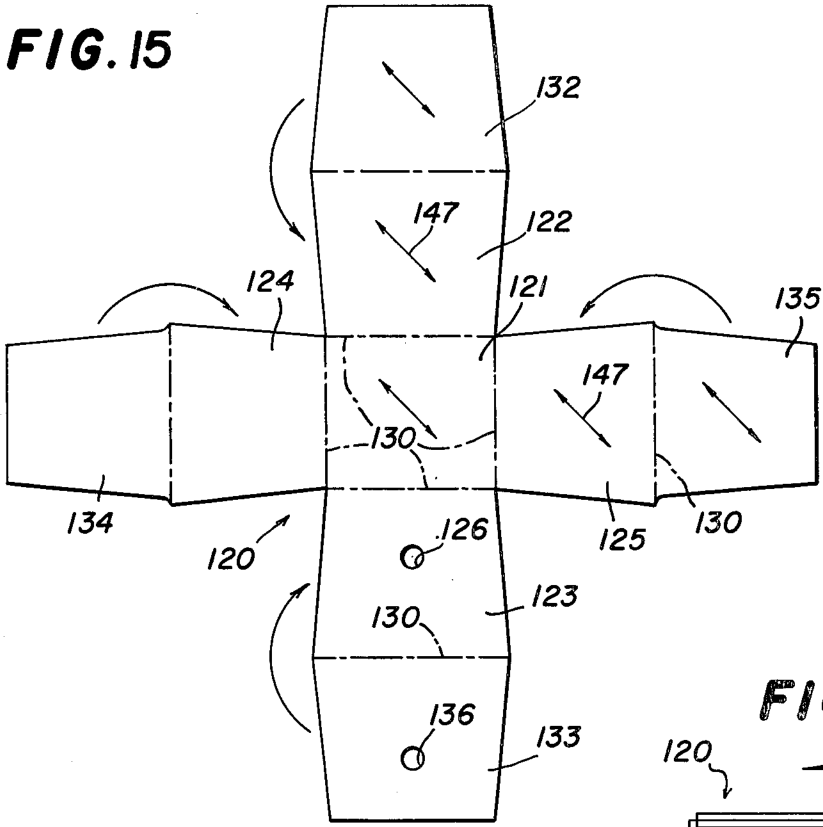
FIG. 15 is a plan view of the corrugated member of the present invention shown laid out flat.

Referring now also to FIGS. 4 through 6 of the drawings, there is provided an integral grille plate, generally designated by the numeral 150, and preferably molded of suitable plastic material, such as a polypropylene copolymer. The grille plate 150 is generally rectangular in shape and includes a body 151 having an inwardly and rearwardly sloping external peripheral surface 152 extending around the entire perimeter thereof, and preferably inclined at an angle of approximately 5 degrees with respect to the front-to-rear axis of the grille plate 150. The rear end of the peripheral surface 152 terminates at a flat planar rear surface 153 which lies in a plane substantially normal to the front-to-rear axis of the grille plate 150, the intersection of the surfaces 152 and 153 defining a corner edge 154. Formed in the rear surface 153 is a large rectangular recess 155 having a flat planar bottom surface 156 substantially parallel to the rear surface 153, the surfaces 153 and 156 being joined by a downwardly and forwardly sloping side surface 157 which extends around the entire perimeter of the recess 155 and is inclined at a draft angle of approximately 5 degrees to the front-to-rear axis of the grille plate 150 to facilitate molding thereof.

Projecting forwardly from the body 151 of the grille plate 150 are a plurality of vertically spaced-apart and horizontally extending wedge-shaped large vanes 160, each of the vanes 160 having forwardly converging upper and lower surfaces 161. The vanes 160 extend substantially across the entire width of the grille plate 150 and have tapered ends as at 162. Respectively disposed adjacent to the top and bottom of the grille plate 150 and projecting forwardly therefrom are two small vanes 163, each being generally wedge-shaped and having forwardly converging upper and lower surfaces 164 and being spaced a predetermined distance from the adjacent ones of the large vanes 160. The large vanes 160 are spaced apart from one another by slots or apertures 166 which extend completely through the body 151 and communicate with the recess 155 at the rear of the grille plate 150. The large vanes 160 project forwardly from the body 151 about twice as far as the small vanes 163, the distance between the front edges or tips of the vanes 160 and the body 151 being substantially greater than the vertical height of the slots 166 separating the vanes 160. The horizontal slots 166 between the vanes 160 are of different lengths so that the ends of the slots 166 lie along an imaginary circle having a diameter slightly less than the diameter or maximum dimension of the gasket 57 of the loudspeaker 51 (see FIG. 4). Integral with the recessed surface 156 of the grille plate 150 and projecting rearwardly therefrom adjacent to the corners thereof are four posts 167 each terminating in a conical tip 168 (see FIG. 7).

The loudspeaker 51 is mounted on the grille plate 150 by placing the attachment flange 56 in the rectangular recess 155 on the rear of the grille plate 150, with the posts 167 being respectively received through the holes 58 in the loudspeaker attachment flange 56, and with the gasket 57 being disposed against the recessed surface 156 of the grille plate 150 in surrounding relationship with the circular array of slots 166. The gasket 57 is then pressed firmly against the recessed surface 156 of the grille plate 150 and the distal ends 168 of the posts 167 are melted by suitable means, such as ultrasonic energy, to form enlarged heads 169 (see FIG. 8) disposed snugly against the rear surface of the loudspeaker attachment flange 56 and having a diameter substantially greater than the diameter of the holes 58 through the loudspeaker attachment flange 56 to provide a rivet-like attachment of the loudspeaker 51 to the grille plate 150.

When thus assembled, the gasket 57 provides a substantially watertight seal between the loudspeaker 51 and the grille plate 150 around the entire perimeter of the circular array of slots or apertures 166, while accommodating emission of sound waves from the front surface of the speaker diaphragm 54 through the slots 166. The front or forwardly facing portion of the loudspeaker 51, including the front surface of the loudspeaker diaphragm 54, is coated with a water-repellent coating, so that any water which finds its way through the slots 166 will not permeate the loudspeaker diaphragm 54.

The grille plate 150, with the loudspeaker 51 mounted thereon is now ready to be assembled with the housing 101. In this process, the loudspeaker 51 is inserted within the corrugated member 120 and the housing 101, with the lead wires 59 being passed through the holes 126 and 136 in the corrugated member 120 and the hole 108 in the housing bottom wall 103, to the outside of the housing 101 (see FIG. 3). The grille plate body 151 is shaped complementary to the front opening in the housing 101, but the dimensions of the body 151 along the rear corner edge 154 are slightly greater than the dimensions of the front opening of the housing 101 along the rear edge of the shear surface 112. Thus, when the grille plate 150 is inserted into the front opening of the housing 101, the corner edge 154 thereof will strike the shear surface 112 at a point P (see FIG. 7) well forward of the rear end thereof.

When the grille plate 150 is thus engaged with the shear surface 112 of the housing 101 ultrasonic energy is applied to the grille plate 150 by means of an ultrasonic horn which is placed over the grille plate 150 and is so dimensioned and arranged as to concentrate ultrasonic energy in the region of the peripheral surface 152, and particularly the rear edge 154, while the grille plate 150 is simultaneously pushed rearwardly against the housing 101. The ultrasonic energy causes the housing 101 to melt along the shear surface 112 ahead of the rear edge 154 of the grille plate 150, thereby permitting the grille plate 150 to be moved rearwardly until the rear surface 153 thereof abuts against the shoulder 114 of the housing 101, and causing the peripheral surface 152 of the grille plate 150 to be fused to the shear surface 112 of the housing 101 around the entire perimeter of the grille plate 150. It will be appreciated that in this ultrasonic welding operation, because the grille plate 150 is of larger dimensions than the rear end of the shear surface 112, material will be sheared from the shear surface 112 in the region designated S in FIG. 8, the excess material being accommodated in the trough 113. The ultrasonic welding of the grille plate 150 to the housing 101 provides a watertight closure therebetween around the entire perimeter thereof. It will also be appreciated that the rear surface 153 of the grille plate 150 cooperates with the rear wall 106 of the housing 100 firmly to trap the corrugated member 120 therebetween.

Referring now also to FIGS. 9 through 14 of the drawings, there is illustrated a rectangular mounting plate 170 which is shaped complementary to the recess 107 in the bottom wall 103 of the housing 101 and is adapted to be received therein. Integral with the mounting plate 170 and extending downwardly therefrom is a generally triangular-shaped keel 171 provided at the bottom end thereof with an upwardly extending slot 172 having an arcuate upper end. Integral with the mounting plate 170 and projecting a slight distance upwardly therefrom is a ridge 174 which extends all the way around the mounting plate 170 a predetermined distance inwardly from the peripheral edge thereof, the ridge 174 being substantially triangular in transverse cross section.

Preferably, the mounting plate 170 is molded of the same polypropylene copolymer as the housing 101 and the grille plate 150. In assembling the mounting plate 170 to the housing 101, the mounting plate 170 is placed in the recess 107 (see FIGS. 3 and 12), with the loudspeaker lead wires 59 being disposed in the channel 109 so that the ridge 174 may contact the recessed surface 107 without crushing the lead wires 59. The mounting plate 170 is then ultrasonically welded to the housing 101 by the use of a suitable ultrasonic horn 175 which is dimensioned and arranged so as to push the mounting plate 170 against the housing bottom wall 103, while concentrating ultrasonic energy in the region of the ridge 174, the ridge 174 serving to direct both the ultrasonic energy and the pushing force against the mounting plate 170 for melting the ridge 174 and fusing it to the housing bottom wall 103.

More particularly, the material of the ridge 174, when melted, flows and spreads out to form a relatively wide band of weld material 177 along the entire length of the ridge 174 (see FIGS. 10 and 14), the molten material flowing down into the channel 109 and around the lead wires 59 for completely blocking the channel 109. Thus, it will be seen that an ultrasonic weld is formed which completely surrounds the hole 108 in the housing bottom wall 103 and completely blocks the channel 109, thereby fixedly securing the mounting plate 170 to the housing 101 while forming a watertight closure for the hole 108 and channel 109 without damage to the lead wires 59.

It can now be appreciated that when the mounting plate 170 is thus assembled to the housing 101, all of the apertures and openings into the housing 101 have been completely closed with watertight seals to prevent moisture from entering the housing 101 and damaging either the loudspeaker 51 or the corrugated member 120, while permitting emission of sound waves from the enclosure 100 through the slots 166. While the water-repellent coating on the front portion of the loudspeaker 51 closing the slots 166 prevents water from penetrating to the inside of the loudspeaker assembly 50, nevertheless water on the outer surface of the diaphragm 54 will impair the quality of sound reproduction by the loudspeaker 51, so the vanes 160 and 163 serve to minimize the possibility of water reaching the diaphragm 54.

The enclosure 100 is adapted to be mounted on a base, generally designated by the numeral 180. The base 180 includes a generally rectangular foot 181 adapted to be secured by any suitable means to an associated support surface 187 (see FIG. 2), such as on a vehicle, on or adjacent to the outside of a building, or any other desired outside location exposed to the elements. Integral with the foot 181 and extending upwardly therefrom is a post 182 which terminates at the upper end thereof in a pair of laterally spaced-apart and upwardly extending clevis legs 183 and 184. A bolt 185 or other suitable fastening means extends through complementary openings in the celvis legs 183 and 184 and is held in place by suitable means such as a wing nut 186. In use, the keel 171 of the mounting plate 170 is disposed between the clevis legs 183 and 184, with the bolt 185 being received in the slot 172, as illustrated in FIG. 3. The clevis legs 183 and 184 are sufficiently flexible that they can be tightly clamped against the opposite sides of the mounting plate keel 171 upon tightening of the wing nut 186 for securely holding the enclosure 100 in any desired mounting position. Preferably, the base 180 is molded of the same material as the mounting plate 170, the housing 101 and the grille plate 150.

In normal use, the enclosure 100 will be mounted so that the front-to-rear longitudinal axis thereof is disposed substantially horizontally, as illustrated in FIG. 3. When so oriented, it will be appreciated that the front flange 110 of the housing 101 serves to shield the grille plate 150 from wind and precipitation. Should any precipitation be blown inside the front flange 110, the vanes 160 and 163 of the grille plate 150 further serve to deflect precipitation away from the slots 166 between the vanes 160. Because of the front-to-rear length of the vanes 160 as compared with the vertical spacing therebetween, it will be appreciated that precipitation would have to impinge upon the grille plate 150 virtually horizontally in order to pass through the slots 166. In the unlikely event that precipitation should pass through the slots 166, the waterproof coating on the loudspeaker diaphragm 54 will prevent moisutre from passing therethrough. In the event of unusually severe weather when there is a danger that precipitation might pass through the slots 166, the front of the enclosure 100 may be tilted downwardly (counterclockwise as viewed in FIG. 3) by loosening the wing nut 186.

While the housing 101, the grille plate 150, the mounting plate 170 and the base 180 have all been disclosed as being constructed of a polypropylene copolymer, it will be understood that these parts may be constructed of any suitable material which is impervious to water. However, it is preferable that these parts all be constructed of the same material for simplicity and economy of manufacture and to facilitate the welding of the parts. It will also be understood that if ultrasonic welding is used, the parts should be constructed of a material which is suitable for that type of welding. In the preferred embodiment ultrasonic energy at a frequency of about 20,000 c.p.s. is used in the welding process.

While the corrugated member 120 has been illustrated as being formed of corrugated fiberboard of paperboard for simplicity and economy of fabrication, it will be appreciated that other corrugated materials may be used to produce the same sound-deadening effect, as long as the adjacent layers of corrugated material have the corrugations thereof crossed with respect to each other in substantially all of the walls of the enclosure 100. Also, while only one loudspeaker and one opening have been shown in the loudspeaker assembly 50, it will be appreciated that any desired number of loudspeakers and corresponding openings may be provided.

Figure 20:
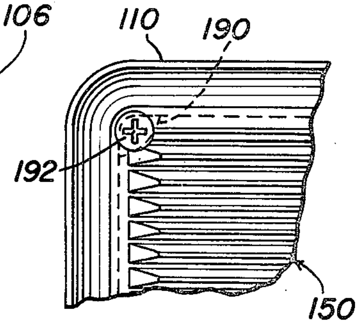
FIG. 20 is a fragmentary front elevational view of another embodiment of loudspeaker assembly wherein the grille plate is screwed to the housing.
Figure 21:
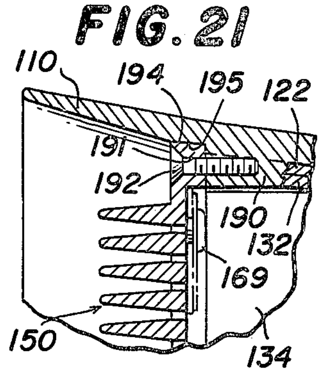
FIG. 21 is a fragmentary view in vertical section, similar to FIG. 3, showing the mounting arrangement of FIG. 20.

Referring now to FIGS. 20 and 21 of the drawings, there is illustrated another embodiment of the present invention, wherein the grille plate 150 is screwed to the housing 101. More particularly, in this embodiment the inner surfaces 115 of the housing 101 are provided at the front ends thereof with four internally threaded lugs 190, respectively disposed in the four corners of the housing 101. The four corners of the grille plate 150 are provided with apertures 191 therethrough disposed for alignment with the lugs 190 when the grille plate 150 is disposed in place against the shoulder 114 of the housing 101. The grille plate 150 has a peripheral surface 194 dimensioned and arranged for cooperation with a mating interior surface 195 on the housing 101 so that the surfaces 194 and 195 will mate to provide a snug fit therebetween, while permitting the grille plate 150 to be moved all the way back against the shoulder 114 of the housing 101. Screws 192 extend through the apertures 191 in the grille plate 150 for threaded engagement with the lugs 190 securely to fasten the grille plate 150 to the housing 101 and provide a substantially watertight seal therebetween.

From the foregoing, it can be seen that there has been provided a novel and improved loudspeaker assembly which provides good acoustical quality, while at the same time being weatherproof so as to be suitable for use outdoors.

More particularly, there has been provided a loudspeaker assembly which includes an enclosure of corrugated material for the louspeaker, the corrugated material and loudspeaker both being encased in the housing which is impervious to water.

There has also been provided a louspeaker assembly of the type set forth, wherein the housing includes an integral open-ended plastic housing member in which is received the corrugated material having two layers of corrugations on most of the housing walls, and a grille plate which closes the open end of the housing member and to which is fixedly secured a loudspeaker in a manner so as to permit emission of sound waves from the housing while maintaining the housing impervious to water.

There has also been provided a loudspeaker assembly of the type set forth, wherein the loudspeaker is secured to the grille plate by rivet-like fasteners.

There has also been provided a loudspeaker assembly of the type set forth, wherein the loudspeaker lead wires are passed through a hole in the bottom of the housing, the housing being provided with a mounting plate which is secured to the housing so as to provide a watertight closure for the lead wire hole.

There has also been provided a loudspeaker assembly of the type set forth, which includes an improved corrugated member cut to form a plurality of hingedly interconnected panels foldable to an assembled configuration so as to fit snugly within the housing and to provide two layers of corrugations on all of the walls surrounding the housing opening.

There has also been provided a novel and improved method of making a loudspeaker assembly of the type set forth, wherein the housing and the grille plate and the mounting plate are all molded of plastic material and are ultrasonically welded together.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A weatherproof loudspeaker assembly comprising a housing formed of water-impermeable material and having an aperture therein to facilitate the emission of sound waves therefrom, corrugated material disposed within said housing and lining at least a substantial portion thereof with two layers of corrugations arranged to facilitate suppression of undesirable sound waves in said housing, loudspeaker means disposed within said housing and said corrugated material and having a water-repellent front portion, and means mounting said loudspeaker means on said housing with said water-repellent front portion closing said aperture and forming a watertight seal between said front portion and said housing around the entire perimeter of said aperture, thereby to render said loudspeaker assembly watertight.

2. A weatherproof loudspeaker assembly comprising an integral housing member formed of waterimpermeable material and having a loudspeaker opening therein, corrugated material disposed within said housing and lining at least a substantial portion thereof with two layers of corrugations arranged to facilitate suppression of undersirable sound waves in said housing, a grille plate formed of water-impermeable material and having an aperture therein to facilitate the transmission of sound waves therethrough, means securing said grille plate to said housing member for cooperation therewith to close said loudspeaker opening and form a watertight seal around the perimeter thereof, loudspeaker means disposed within said housing and said corrugated material and having a water-repellent front portion, and means mounting said loudspeaker means on said grille plate with said water-repellent front portion closing said aperture and forming a watertight seal between said front portion and said grille plate around the entire perimeter of said aperture, thereby to render said loudspeaker assembly watertight.

3. A weatherproof loudspeaker assembly comprising a closed housing formed of water-impermeable material and having a first aperture therein to facilitate the emission of sound waves therefrom and a second aperture therein to accommodate the passage therethrough of loudspeaker lead wires, loudspeaker means disposed within said housing and having a water-repellent front portion, means mounting said loudspeaker means on said housing with said water-repellent front portion closing said first aperture and forming a watertight seal between said front portion and said housing around the entire perimeter of said aperture, said loudspeaker means including lead wires extending through said second aperture to the outside of said housing, and mounting means secured to said housing for cooperation therewith and with said loudspeaker lead wires to form a watertight closure for said second aperture, thereby to render said loudspeaker assembly watertight.

4. The weatherproof loudspeaker assembly set forth in claim 3, wherein said mounting means is secured to said housing by ultrasonic welding.

5. The weatherproof loudspeaker assembly set forth in claim 3, wherein said housing has a recess formed in the outer surface thereof in surrounding relationship with said second aperture and a narrow channel further recessed with respect to said recess and providing communication between said second aperture and the outside of said housing at a point beyond the perimeter of said recess, said lead wires extending through said second aperture and said channel to the outside of said housing, said mounting means being shaped and dimensioned to be received in said recess and secured to said housing thereat without interference with said lead wires in said channel.

6. The weatherproof loudspeaker assembly set forth in claim 3, wherein said housing has a recess formed in the outer surface thereof in surrounding relationship with said second aperture and a narrow channel further recessed with respect to said recess and providing communication between said second aperture and the outside of said housing at a point beyond the perimeter of said recess, said lead wires extending through said second aperture and said channel to the outside of said housing, said mounting means being shaped and dimensioned to be received in said recess without interference with said lead wires in said channel and being ultrasonically welded to said housing thereat with a weldment which surrounds said second aperture and closes said channel.

7. The weatherproof loudspeaker assembly set forth in claim 3, wherein said second aperture is formed in the bottom of said housing.

8. A weatherproof loudspeaker assembly comprising a closed housing formed of water-impermeable material and having a first aperture therein to facilitate the emission of sound waves therefrom and a second aperture therein to accommodate the passage therethrough of loudspeaker lead wires, corrugated material disposed within said housing and lining at least a substantial portion thereof with two layers of corrugations arranged to facilitate suppression of undesirable sound waves in said housing, loudspeaker means disposed within said housing and said corrugated material and having a water-repellent front portion, means mounting said loudspeaker means on said housing with said water-repellent front portion closing said first aperture and forming a watertight seal between said front portion and said housing around the entire perimeter of said aperture, said loudspeaker means including lead wires extending through said second aperture to the outside of said housing, and mounting means secured to said housing and cooperating therewith and with said loudspeaker lead wires to form a watertight closure for said second aperture, thereby to render said loudspeaker assembly watertight.

9. The weatherproof loudspeaker assembly set forth in claim 8, and further including a grille plate formed of water-impermeable material and having an aperture therethrough to facilitate the transmission of sound waves therethrough, means mounting said loudspeaker means on said grille plate with said water-repellent front portion closing said opening and forming a watertight seal between said front portion and said grille plate around the entire perimeter of said opening, and means securing said grille plate to said housing member for cooperation therewith to close said first aperture and form a watertight seal around the entire perimeter thereof.

10. A weatherproof loudspeaker assembly comprising a closed housing formed of water-impermeable material and including four side walls and two end walls all interconnected and arranged in the form of a hexahedron, one of said end walls having an aperture therein to facilitate the emission of sound waves from said housing, an integral corrugated member having cuts partway through the thickness thereof respectively to form hinges, said hinges dividing said corrugated member into a generally rectangular end panel and four outer side panels respectively hingedly connected to the sides of said end panel and four inner side panels respectively hingedly connected to said outer side panels, said panels being disposed in an assembled configuration wherein said inner side panels respectively overly the outer side panels to which they are hingedly connected and cooperate therewith to form four corrugated side walls each having two layers of corrugations arranged to facilitate suppression of undesirable sound waves in said housing, said corrugated member being disposed within said housing with said end panel lying against the other one of said housing end walls and with said corrugated side walls respectively lying against said housing side walls, loudspeaker means disposed within said housing and said corrugated material and having a water-repellent front portion, and means mounting said loudspeaker means on said housing with said water-repellent front portion closing said aperture and forming a substantially watertight seal between said front portion and said one housing wall around the entire perimeter of said aperture, thereby to render said loudspeaker assembly watertight.

11. The weatherproof loudspeaker assembly set forth in claim 10, wherein two opposed ones of said inner side panels have widths which are respectively substantially less than the widths of the corresponding outer side panels for cooperation therewith to form marginal recesses, said recesses having a width sufficient to accommodate the margins of the other two opposed inner side panels when said corrugated member is in the assembled configuration thereof.

12. A weatherproof loudspeaker assembly comprising an integral housing member formed of water-impermeable material and including an end wall and four side walls all interconnected and arranged generally in the form of a hexahedron with said side walls cooperating to define a generally rectangular loudspeaker opening, a grille plate formed of water-impermeable material and having a first aperture therein to facilitate the emission of sound waves from said housing, said housing member having a second aperture therein to accommodate the passage therethrough of loudspeaker lead wires, means securing said grille plate to said housing member for cooperation therewith to close said loudspeaker opening and form a watertight seal around the entire perimeter thereof, an integral corrugated member having cuts partway through the thickness thereof respectively to form hinges, said hinges dividing said corrugated member into a generally rectangular end panel and four outer side panels respectively hingedly connected to the sides of said end panel and four inner side panels respectively hingedly connected to said outer side panels, said panels being disposed in an assembled configuration wherein said inner side panels respectively overly the outer side panels to which they are hingedly connected and cooperate therewith to form four corrugated side walls each having two layers to corrugations arranged to facilitate suppression of undesirable sound waves in said housing, said corrugated member being disposed within said housing with said end panel lying against said housing end wall and with said corrugated side walls respectively lying against said housing side walls, loudspeaker means disposed within said housing and said corrugated material and having a water-repellent front portion, means mounting said loudspeaker means on said grille plate with said water-repellent front portion closing said first aperture and forming a substantially watertight seal between said front portion and said grille plate around the entire perimeter of said first aperture, said loudspeaker means including lead wires extending through said second aperture to the outside of said housing, and mounting means secured to said housing member and cooperating therewith and with said loudspeaker lead wires to form a watertight closure for said second aperture, thereby to render said loudspeaker assembly watertight.

13. A weatherproof loudspeaker assembly comprising an integral housing member formed of water-impermeable material and having a loudspeaker opening therein, a grille plate formed of water-impermeable material and including a plurality of headed rivet-like members integral therewith and extending rearwardly therefrom, said grille plate having an aperture therein to facilitate the transmission of sound waves therethrough, means securing said grille plate to said housing member to form a watertight seal therebetween, loudspeaker means disposed within said housing and having a water-repellent front portion, said loudspeaker means having a plurality of openings therethrough respectively receiving said rivet-like members therethrough for supporting said loudspeaker means on said grille plate with said water-repellent front portion closing said aperture, and means cooperating with said loudspeaker means and said grille plate to form a watertight seal therebetween around the entire perimeter of said aperture, thereby to render said loudspeaker assembly watertight.

14. The weatherproof loudspeaker assembly set forth in claim 13, wherein said loudspeaker opening is substantially rectangular in shape, said grille plate having a plurality of spaced-apart parallel slots extending therethrough with the ends of said slots all lying along a common circle.

15. The weatherproof loudspeaker assembly set forth in claim 13, wherein said means for securing said grille plate to said housing member comprises threaded fastening means.

16. The weatherproof loudspeaker assembly set forth in claim 13, wherein said means securing said grille plate to said housing member comprises an ultrasonic weldment.

17. A method of making a weatherproof loudspeaker assembly comprising the steps of providing an integral housing member formed of water-impermeable material and having a loudspeaker opening therein, providing a grille plate formed of water-impermeable material and shaped complementary to said loudspeaker opening and having an aperture therethrough, providing loudspeaker means having a water-repellent front portion, fixedly securing said loudspeaker means to said grille plate with said front portion of said loudspeaker means closing said aperture and cooperating with said grille plate so as to form a substantially watertight seal therebetween around the entire perimeter of said aperture, and welding said grille plate to said housing member around the entire perimeter of said loudspeaker opening with said loudspeaker means disposed within said housing member, thereby to render said loudspeaker assembly watertight.

18. The method of claim 17, wherein said housing member and said grille plate are both formed of a polypropylene copolymer, said welding step comprising ultrasonic welding.

19. The method of claim 17, and further including the step of lining the inside of said housing member with corrugated material.

20. A method of making a weatherproof loudspeaker assembly comprising the steps of providing an integral housing member formed of water-impermeable material and having a loudspeaker opening therein, lining the inside of said housing member with corrugated material with two layers of corrugations along at least a substantial portion of said housing member arranged to facilitate suppression of undesirable sound waves in said housing member, providing a grille plate formed of water-impermeable material and shaped complementary to said loudspeaker opening and having an aperture therethrough, providing loudspeaker means having a water-repellent front portion, fixedly securing said loudspeaker means to said grille plate with said front portion of said loudspeaker means closing said aperture and cooperating with said grille plate so as to form a substantially watertight seal therebetween around the entire perimeter of said aperture, and welding said grille plate to said housing member around the entire perimeter of said loudspeaker opening with said loudspeaker means disposed within said housing member and said corrugated material, thereby to render said loudspeaker assembly watertight.

21. A method of making a weatherproof loudspeaker assembly comprising the steps of providing an integral housing member formed of water-impermeable plastic material and having a loudspeaker opening therein, said housing member having an internal peripheral surface adjacent to said loudspeaker opening inclined downwardly and outwardly thereof and terminating at the inner end thereof in a trough and a shoulder extending around the entire perimeter of said loudspeaker opening, providing a grille plate formed of water-impermeable plastic material and shaped complementary to said loudspeaker opening and having an aperture therethrough, said grille plate having an external peripheral surface inclined downwardly and forwardly thereof and terminating at the rear end thereof in a shear edge, the minimum perimeter of said exteral peripheral surface of said grille plate being greater than the minimum perimeter of said internal peripheral surface of said housing member, providing loudspeaker means having a water-repellent front portion, fixedly securing said loudspeaker means to said grille plate with said front portion of said loudspeaker means closing said aperture and cooperating with said grille plate so as to form a substantially watertight seal therebetween around the entire perimeter of said aperture, placing said grille plate adjacent to said loudspeaker opening with said loudspeaker means extending within said housing member and with said shear edge engaging said internal peripheral surface intermediate the inner and outer ends thereof, and applying ultrasonic energy to said shear edge along the entire perimeter thereof and simultaneously pushing said grille plate inwardly of said housing member for melting said internal peripheral surface at said shear edge to permit said grille plate to move and seat against said shoulder with the excess melted material being accommodated in said trough, whereby said internal and external peripheral surfaces are welded together along the entire perimeter thereof, thereby to render said loudspeaker assembly watertight.

22. The method set forth in claim 21, wherein said internal peripheral surface on said housing member is inclined in use at an angle of approximately 5 degrees to the horizontal, said external peripheral surface on said grille plate being inclined in use at an angle of approximately 7 degrees 30 minutes to the horizontal.

23. A method of making a weatherproof loudspeaker assembly comprising the steps of providing an integral housing member formed of water-impermeable plastic material and having a loudspeaker opening therein, said housing member having an internal peripheral surface adjacent to said loudspeaker opening inclined downwardly and outwardly thereof and terminating at the inner end thereof in a trough and a shoulder extending around the entire perimeter of said loudspeaker opening, lining the inside of said housing member with corrugated material with two layers of corrugations along at least a substantial portion of said housing member arranged to facilitate suppression of undesirable sound waves in said housing member, providing a grille plate formed of water-impermeable plastic material and shaped complementary to said loudspeaker opening and having an aperture therethrough, said grille plate having an external peripheral surface inclined downwardly and forwardly thereof and terminating at the rear end thereof in a shear edge, the minimum perimeter of said external peripheral surface of said grille plate being greater than the minimum perimeter of said internal peripheral surface of said housing member, providing loudspeaker means having a water-repellent front portion, fixedly securing said loudspeaker means to said grille plate with said front portion of said loudspeaker means closing said aperture and cooperating with said grille plate so as to form a substantially watertight seal therebetween around the entire perimeter of said aperture, placing said grille plate adjacent to said loudspeaker opening with said loudspeaker means extending within said housing member and said corrugated material and with said shear edge engaging said internal peripheral surface intermediate the inner and outer ends thereof, and applying ultrasonic energy to said shear edge along the entire perimeter thereof and simultaneously pushing said grille plate inwardly of said housing member for melting said internal peripheral surface at said shear edge to permit said grille plate to move and seat against said shoulder with the excess melted material being accommodated in said trough, whereby said internal and external peripheral surfaces are welded together along the entire perimeter thereof, thereby to render said loudspeaker assembly watertight.

24. A method of making a weatherproof loudspeaker assembly comprising the steps of providing an integral housing member formed of water-impermeable material and having a loudspeaker opening therein, providing a grille plate formed of water-impermeable material and shaped complementary to said loudspeaker opening, said grille plate having an aperture therethrough and including a plurality of rearwardly extending posts spaced around said aperture, providing loudspeaker means having a water-repellent front portion including a peripheral sealing and attachment flange provided with openings therethrough dimensioned and arranged respectively to receive said posts therethrough, placing said loudspeaker means against the rear of said grille plate with said posts respectively received through said openings and with said front portion of said loudspeaker means closing said aperture, heating and melting the distal ends of said posts to form enlarged heads which cooperate with said grille plate securely to trap said attachment flange therebetween so as to form a watertight seal between said attachment flange and said grille plate around the entire perimeter of said aperture, and welding said grille plate to said housing member around the entire perimeter of said loudspeaker opening with said loudspeaker means disposed within said housing member, thereby to render said loudspeaker assembly watertight.

25. The method set forth in claim 24, wherein said housing member and said grille plate and said posts all being formed of a polypropylene copolymer, said welding step comprising ultrasonic welding.

26. A method of making a weatherproof loudspeaker assembly comprising the steps of providing an integral housing member formed of water-impermeable material and having a loudspeaker opening therein, lining the inside of said housing member with corrugated material with two layers of corrugations along at least a substantial portion of said housing member arranged to facilitate suppression of undesirable sound waves in said housing member, providing a grille plate formed of water-impermeable material and shaped complementary to said loudspeaker opening, said grille plate having an aperture therethrough and including a plurality of rearwardly extending posts spaced around said aperture, providing loudspeaker means having a water-repellent front portion including a peripheral sealing and attachment flange provided with openings therethrough dimensioned and arranged respectively to receive said posts therethrough, placing said loudspeaker means against the rear of said grille plate with said posts respectively received through said openings and with said front portion of said loudspeaker means closing said aperture, heating and melting the distal ends of said posts to form enlarged heads which cooperate with said grille plate securely to trap said attachment flange therebetween so as to form a watertight seal between said attachment flange and said grille plate around the entire perimeter of said aperture, and welding said grille plate to said housing member around the entire perimeter of said loudspeaker opening with said loudspeaker means disposed within said housing member and said corrugated material, thereby to render said loudspeaker assembly watertight.

27. A method of making a weatherproof loudspeaker assembly comprising the steps of providing an integral housing member formed of water-impermeable material and having a loudspeaker opening and a lead wire opening therein, providing a grille plate formed of water-impermeable material and shaped complementary to said loudspeaker opening and having an aperture therethrough, providing loudspeaker means having lead wires connected thereto and having a water-repellent front portion, fixedly securing said loudspeaker means to said grille plate with said front portion of said loudspeaker means closing said aperture and cooperating with said grille plate so as to form a substantially watertight seal therebetween around the entire perimeter of said aperture, welding said grille plate to said housing member around the entire perimeter of said loudspeaker opening with said loudspeaker means disposed within said housing member and with said lead wires extending through said lead wire opening to the outside of said housing member, providing a plastic mounting member having an attachment surface with a ridge projecting therefrom and extending therearound adjacent to the peripheral edge thereof, placing said ridge against said housing member to surround said lead wire opening, and applying ultrasonic energy to said ridge and simultaneously pushing said mounting member against said housing member for melting said ridge and fusing it to said housing member with the melted portion flowing over and around said lead wires, whereby said mounting member and said housing member are welded together forming a watertight closure around said lead wire opening, thereby to render said loudspeaker assembly watertight.

28. The method of claim 27, wherein said housing member is provided by molding a polypropylene copolymer blown with a blowing agent.

29. The method of claim 27, wherein said housing has a recess formed in the outer surface thereof in surrounding relationship with said second aperture and a narrow channel further recessed with respect to said recess and providing communication between said second aperture and the outside of said housing at a point beyond the perimeter of said recess, said lead wires extending through said second aperture and said channel to the outside of said housing, said mounting means being shaped and dimensioned to be received in said recess without interfering with said lead wires in said channel and being ultrasonically welded to said housing thereat with a weldment which surrounds said second aperture and closes said channel.

30. A method of making a weatherproof loudspeaker assembly comprising the steps of providing an integral housing member formed of water-impermeable material and having a loudspeaker opening and a lead wire opening therein, lining the inside of said housing member with corrugated material with two layers of corrugations along at least a substantial portion of said housing member arranged to facilitate suppression of undesirable sound waves in said housing member, providing a grille plate formed of water-impermeable material and shaped complementary to said loudspeaker opening and having an aperture therethrough, providing loudspeaker means having lead wires connected thereto and having a water-repellent front portion, fixedly securing said loudspeaker means to said grille plate with said front portion of said loudspeaker means closing said aperture and cooperating with said grille plate so as to form a substantially watertight seal therebetween around the entire perimeter of said aperture, welding said grille plate to said housing member around the entire perimeter of said loudspeaker opening with said loudspeaker means disposed within said housing member and said corrugated material and with said lead wires extending through said lead wire opening to the outside of said housing member, providing a plastic mounting member having an attachment surface with a ridge projecting therefrom and extending therearound adjacent to the peripheral edge thereof, placing said ridge against said housing member to surround said lead wire opening, and applying ultrasonic energy to said rigde and simultaneously pushing said mounting member against said housing member for melting said ridge and fusing it to said housing member with the melted portion flowing over and around said lead wires, whereby said mounting member and said housing member are welded together forming a watertight closure around said lead wire opening, thereby to render said loudspeaker assembly watertight.

31. A method of making a weatherproof loudspeaker assembly comprising the steps of providing an integral housing member formed of water-impermeable material and having a loudspeaker opening and a lead wire opening therein, providing a grille plate formed of water-impermeable material and shaped complementary to said loudspeaker opening, said grille plate having an aperture therethrough and including a plurality of rearwardly extending posts spaced around said aperture, providing loudspeaker means having lead wires connected thereto and having a water-repellent front portion including a peripheral sealing and attachment flange provided with openings therethrough dimensioned and arranged respectively to receive said posts therethrough, placing said loudspeaker means against the rear of said grille plate with said posts respectively received through said openings and with said front portion of said loudspeaker means closing said aperture, heating and melting the distal ends of said posts to form enlarged heads which cooperate with said grille plate securely to trap said attachment flange therebetween so as to form a watertight seal between said attachment flange and said grille plate around the entire perimeter of said aperture, welding said grille plate to said housing member around the entire perimeter of said loudspeaker opening with said loudspeaker means disposed within said housing member and with said lead wires extending through said lead wire opening to the outside of said housing member, providing a plastic mounting member having an attachment surface with a ridge projecting therefrom and extending therearound adjacent to the peripheral edge thereof, placing said ridge against said housing member to surround said lead wire opening, and applying ultrasonic energy to said ridge sumultaneously and pushing said mounting member against said housing member for melting said ridge and the portion of said housing member in contact therewith with the melted portion flowing over and around said lead wires, whereby said mounting member and said housing member are welded together forming a watertight closure around said lead wire opening, thereby to render said loudspeaker assembly watertight.

32. A method of making a weatherproof loudspeaker assembly comprising the steps of providing an integral housing member formed of water-impermeable material and having a loudspeaker opening and a lead wire opening therein, lining the inside of said housing member with corrugated material with two layers of corrugations along at least a substantial portion of said housing member arranged to facilitate suppression of undesirable sound waves in said housing member, providing a grille plate formed of water-impermeable material and shaped complementary to said loudspeaker opening, said grille plate having an aperture therethrough and including a plurality of rearwardly extending posts spaced around said aperture, providing loudspeaker means having lead wires connected thereto and having a water-repellent front portion including a peripheral sealing and attachment flange provided with openings therethrough dimensioned and arranged respectively to receive said posts therethrough, placing said loudspeaker means against the rear of said grille plate with said posts respectively received through said openings and with said front portion of said loudspeaker means closing said aperture, heating and melting the distal ends of said posts to form enlarged heads which cooperate with said grille plate securely to trap said attachment flange therebetween so as to form a watertight seal between said attachment flange and said grille plate around the entire perimeter of said aperture, welding said grille plate to said housing member around the entire perimeter of said loudspeaker opening with said loudspeaker means disposed within said housing member and said corrugated material and with said lead wires extending through said lead wire opening to the outside of said housing member, providing a plastic mounting member having an attachment surface with a ridge projecting therefrom and extending therearound adjacent to the peripheral edge thereof, placing said ridge against said housing member to surround said lead wire opening, and applying ultrasonic energy to said ridge simultaneously and pushing said mounting member against said housing member for melting said ridge and the portion of said housing member in contact therewith with the melted portion flowing over and around said lead wires, whereby said mounting member and said housing member are welded together forming a watertight closure around said lead wire opening, thereby to render said loudspeaker assembly watertight.

* * * * *